United States Patent [19]
Patel et al.

[11] Patent Number: 5,591,354
[45] Date of Patent: Jan. 7, 1997

[54] ETCHING PLASTICS WITH NITROSYLS

[75] Inventors: Gordhanbhai N. Patel, Somerset; Subhash H. Patel, Hoboken, both of N.J.

[73] Assignee: JP Laboratories, Inc., Middlesex, N.J.

[21] Appl. No.: 327,237

[22] Filed: Oct. 21, 1994

[51] Int. Cl.$^6$ ............................................. B29C 71/00
[52] U.S. Cl. ......................... 216/83; 427/307; 252/79.2
[58] Field of Search ............................. 216/83; 427/307, 427/306; 252/79.2

[56] References Cited

U.S. PATENT DOCUMENTS

| | | | |
|---|---|---|---|
| 4,532,015 | 7/1985 | Boultinghouse et al. | 427/306 X |
| 5,160,600 | 11/1992 | Patel et al. | 427/307 X |
| 5,180,639 | 1/1993 | Zarnoch | 427/307 X |
| 5,211,803 | 5/1993 | Johnson et al. | 427/307 X |

Primary Examiner—Thi Dang
Attorney, Agent, or Firm—Omri M. Behr, Esq.

[57] ABSTRACT

There is disclosed a process of etching the surface of polymeric materials made of polymers having at least one oxidatively degradable functionality which comprises treating said surface with a solution of at least one member of the etchant group consisting of nitronium, nitrosonium ions and complexes thereof, in a solvent containing less than 40% by weight of water and nitroacidium ions and complexes thereof. The process further comprises use of cosolvents and swellants. It also includes pre and post etching steps directed to the preparation of the surface for etching and removal of the etchant respectively.

50 Claims, No Drawings

ETCHING PLASTICS WITH NITROSYLS

BACKGROUND OF THE INVENTION

1. Field of the Invention

This invention relates to a process of etching plastics for painting and plating. The etched plastics can be plated with conventional plating processes. The etched plastics can also be painted with water based paints.

2. Brief Description of Prior Art

Plastics have been metallized/plated for decorative and functional (e.g., EMI shielding) purposes. Several plastics, such as copolymers of acrylonitrile, butadiene and styrene (referred herein as to ABS), alloys of ABS (e.g., an alloy of ABS and polycarbonate), polycarbonate, polyvinyls, such as polyvinylchloride, polyolefins, such as polybutadiene, polyepoxide, polyphenylene sulfide, and polyphenylene oxide have heretofore been etched with chromic acid for metallization. Chromic acid is highly toxic, expensive, and creates sludge. There is a need for formulations and processes which are less toxic, less polluting, and less expensive for etching plastics for plating and painting.

A number of substitutes have been proposed for chromic acid for etching plastics, such as ABS, polyamides, polyesters, polyepoxy resins, polyimides and polyvinylchloride for plating. They include bases, such as NaOH (U.S. Pat. Nos. 3,554,880; 3,770,528; 3,791,848; 4,131,698; 4,422,907; 4,505,786; 4,528,245; 4,592,852; 4,629,636; 4,725,504; 4,803,097; 4,820,553; 4,832,799; and 4,959,121), NaOCl (U.S. Pat. Nos. 3,460,897; 4,592,852 and 4,629,636), hydrogen peroxide (U.S. Pat. No. 4,645,573), nitric acid (U.S. Pat. Nos. 3,471,320; 4,959,121; 5,198,096 and 5,160,600), phosphoric acid, acetic acid and chromic acid (U.S. Pat. Nos. 3,484,270 and 3,522,073), molybdic acid (U.S. Pat. Nos. 3,563,163 and 3,567,532), potassium permanganate (U.S. Pat. Nos. 3,598,630; 3,652,351; 3,819,394, 4,042,729; 4,073,740; 4,859,300; 4,959,121 and 5,112,513), and sulfur trioxide (U.S. Pat. Nos. 4,298,636; 4,520,046 and 4,556,587).

Prior to etching plastics for electroless plating, they are sometimes pre-treated with a solvent system to swell the surfaces. Solvent pretreated/swollen surfaces are micro-toughened and hence are relatively easy to etch and hence provide better adhesion of the plated metals. A number of solvents, such as butyrolactone, propylene carbonate, glymes, and methanol, have been proposed in a number of patents (e.g., U.S. Pat. Nos. 3,445,350; 3,689,303; 3,769,061; 3,795,622; 3,963,590; 4,063,004; 4,131,698; 4,775,449; 5,019,425; 5,132,191; 5,178,956; 5,180,639; and 5,185,185). However, in order to get improved adhesion, the solvent must be removed from the surface and the surface still requires etching. There is a need for an etching formulation which simultaneously swells the surface.

Nitrosyl sulfuric acid, [HO(O=)S(=O)ONO or $NO^+HSO^4-$], which is also known as nitrosyl sulfate, chamber crystals, nitrososulfuric acid, nitroxysulfuric acid, nitrosulfonic acid, nitrosyl hydrogen sulfate, nitro acid sulfite, and nitrose is mainly used for preparing azo derivatives of aromatic amines (e.g. U.S. Pat. No. 5,162,511). Nitrosyl sulfuric acid is referred to herein as NSA. Solid NSA decomposes at 73° C. NSA decomposes with formation of $HNO_3$ and $H_2SO_4$ upon exposure to moisture. It is soluble in sulfuric acid and decomposes violently upon addition of water.

NSA is known to react as a nitrosyl cation or nitrosonium cation ($NO^+$) with other nucleophiles including unsaturated compounds, such as 1,3-dienes [Chem. Ber. 99, 556 (1966)]. $NO^+$ is also capable of halogen abstraction from alkyl halides [G. A. Olah et al, Synthesis, 274 (1979) and 713 (1983)]. $NO^+$ is an mild oxidizing agent. It is a powerful one electron oxidant [Lee et al, Inorg. Chem., 29, 4196 (1990) and Kim et al, J. Amer. Chem. Soc., 113, 4962 (1991)] and is therefore used as an oxidative dopant for polymers. It has been used to oxidatively cleave oximes, hydrazones, thioketals, ethers etc. to their corresponding carbonyl compounds [Synthesis, 418 (1977), 273 (1979), 609 and 610 (1976), J. Org. Chem., 42, 309 (1977)]. The $NO^+$ is electrophilic, and therefore reacts with a large number of basic molecules. The nitrosonium cation also forms adducts with crown ethers. Though the reactions of NSA have been reported with a number of small molecules, there is no report on its reactions with polymers, especially for etching and chemical modification of the polymers.

SUMMARY OF THE INVENTION

There is disclosed a process of etching the surface of polymeric materials made of polymers having at least one oxidatively degradable functionality which comprises treating said surface with a solution of at least one member of the etchant group consisting of nitronium ion ($NO_2^-$) and nitrosonium ion ($NO^+$), and complexes thereof in a solvent, the solution containing the foregoing should contain less than 40% by weight of water. Nitroacidium ions ($H_2NO_2^+$) and complexes thereof may also be used, however the amount of water present therewith is not limited.

The solvent may comprise at least one member of the group consisting of mineral acids, and aliphatic and aromatic carboxylic and sulfonic acids. The solvent additionally may further comprises a cosolvent or a swellant. While the materials used in each of these categories may be the same, their purpose may differ.

Suitably, the cosolvent or swellant may be selected from the group consisting of organic acids, sulfoxides, ethers, sulfolane, halocarbons, haloalkanols and haloalkanoic acids, hetero linear and cyclic-compounds containing oxygen, and hydrocarbons.

The amount of swellant required may be reduced by carrying out the process in the presence of a concentrated aqueous solution of least polluting and least toxic compounds such as an alkali metal salt or alkaline earth metal salt.

The process may additionally comprise a pre-etch step in which the surface of the polymer is pretreatment with sulfuric acid containing from about 25 to about 85 wt. % of sulfuric acid in the presence of 0 to 10 wt. % of nitric acid or silver nitrate, or this step may comprise swelling the polymer prior to etching.

The pre-etch step may also contain a swellant compatible with the acidic pre-etch medium.

As stated above, the etchant solution which contains a cosolvent may additionally comprise swellant for the polymer.

The etching process may not only be preceded by, a pretreatment step but may also be followed by postetching step, or indeed both may be used. In the post treatment step, there is used a similar concentration of sulfuric acid as in the pre-etch step alone, or with agents capable of oxidizing nitronium, nitrosonium or nitroacidium ions-or a combination of both.

The polymers which are etchable in the manner discussed above include ABS, polyanhydrides, polycarboxylesters, polysulphonic esters, unsaturated polyolefins, polyepoxides, polycarbonates, polyamides, polyesters, polyacrylates, thermosets, polyurethanes, polyepoxys, halo polymers, copolymers and alloys of such polymers.

Where the polymers are selected from the group consisting of polystyrene, polyvinylchloride, polyethylene and polypropylene a swellant should be used either as a pretreatment or it should be present in the etching bath.

The etching procedures discussed herein will provide a water wettable surface which will give suitable levels of adhesion for painting with water and oil based paints as well as for electroless plating.

As a variant of the foregoing procedure, a substantially a non platable (or paintable) surface may be made capable of being plated by electroless plating (or painting) by preparing an emulsion solution of a polymer such as a copolymer of acrylonitrile, butadiene and styrene, in a solvent such as a mixture of acetonitrile and poly(ethylene glycol) diacetate, coating this emulsion on said non platable surface, drying the surface and then subjecting it to the process or processes discussed herein.

Thereafter the thus prepared surface is subjected to the steps of washing to remove the etching agent therefrom and then painting with a water based paint or plating with electroless nickel or electroless copper.

As a further embodiment, prior to etching, the pretreatment step may comprise a preliminary step of swelling the surface of the polymer with swellant therefor.

Such swellants include organic acids, nitrocompounds, amides, esters, carbonates, sulfoxides, ethers, ketones, sulfolane, halocarbons, haloalkanols and haloalkanoic acids, hetero linear and cyclic-compounds containing oxygen, and hydrocarbons.

Where desired, the amount of swellant required is reduced by carrying out the process in the presence of an aqueous solution of an alkali metal hydroxide or a concentrated aqueous solution of an alkali metal or alkaline earth metal salt.

DESCRIPTION OF THE PREFERRED EMBODIMENTS

The polymers which may be etched by the process of the present invention include polyanhydrides, polycarboxylesters, polysulphonic esters, unsaturated polyolefins, polyepoxides, polycarbonates, polyamides, polyesters, polyacrylates, thermosets, polyurethanes, polyepoxys, halo polymers and copolymers and alloys of such polymers. Specifically included are copolymers of acrylonitrile, butadiene and styrene, and alloys thereof with polycarbonate; polycarbonate, polybutadiene, polyepoxide, polyphenylene sulfide, polycaprolactone, nylon 6 and 66, polyethylene terephthalate, cellulose acetate, polyvinylacetate, polymethylmethacrylate, phenolformaldehyde resin, polyphenylene oxide, polyurea, polyurethane, SMC (sheet molding compound), polyvinylbutyral, polyacrylonitrile, polychloroprene, copolymers and alloys of said polymers. Also included are polystyrene, polyvinyl-chloride, polyethylene and polypropylene. These latter polymers however must be preswollen prior to etching.

In the process of etching the surface of polymeric materials made of polymers having at least one oxidatively degradable functionality, the etchant the solution may contain between 1 and 80% by weight of at least one member of the etchant group, suitably selected from the group consisting of nitrosyl sulfuric acid, nitrosonium tetrafluoroborate, nitrosonium hexafluorophosphate, nitrosonium hexachloroantimonate, nitrosonium halides, nitrosonium nitrate, nitrosonium phosphate, nitrosonium carboxylates, nitrosonium perchlorate, $NOPF_6$, NOPF, metal nitrosyls, nitrosyl halides, nitrosyl acetate, nitrosyl sulfate, nitrosyl sulfuric anhydride and mixtures thereof, most suitably nitrosyl sulfuric acid.

The solvent suitably comprises at least one member of the group consisting of mineral acids, and aliphatic and aromatic carboxylic and sulfonic acids, preferably sulfuric acid, nitric acid, hydrochloric acid, phosphoric acid, acetic acid, propionic acid, benzoic acid, methanesulphonic acid, benzenesulphonic acid or trifluoromethane sulphonic acid, most suitably the solvent comprises sulfuric acid.

The etching process can be accelerated by a co-etchant or catalyst. A small quantity of silver nitrate and nitric acid accelerate/catalyze the etching. Concentration of co-etchant/catalyst required for etching depends upon the concentrations of NSA and the solvent and the time-temperature of etching. Preferably the concentration of catalyst/co-etchant is 0.01 to 10 wt. %. Most preferably the concentration is 0.2 to 2 wt. %.

Where the solvent additionally comprises a cosolvent and a swellant or where the cosolvent itself is a swellant for the polymer, it is preferred for it to be selected from the group consisting of C1-C5 alkanoic acids, C1-C5 alkyl-, phenylo and C1-C5 alkylphenyl-sulfonic acids, diphenyl and di(C1-C5 alkyl)phenyl ethers, poly(C2-C5 alkylene glycol) di(C1-C5 alkyl)ethers, C4-C6 cycloalkylethers, polyhalo C1-C5 alkanols, polyhalo C1-C5 alkanoic acids, trihalosulfonic acids, polyhalobenzenes and polyhalo C1-C5 alkyl benzenes, C7-C12 alkyl- and aryl-and alkaryl hydrocarbons. Most suitably the cosolvent or swellant may be acetic acid, propionic acid, methane- or benzene sulfonic acids, diphenyl ether, tri(ethylene glycol) dimethyl ether, tetrahydrofuran, trichloroethanol, trichloroacetic acid, trichlorosulfonic acid, dichlorobenzene, octane, toluene or xylene.

It has been found that the amount of swellant required is reduced by carrying out the process in the presence of a concentrated aqueous solution and inorganic, organic water soluble compounds such as an alkali metal salt or alkaline earth metal salt.

Suitably, the process is carried out in a temperature range of from about 10° to about 90° C., preferably in a temperature range of from about 20° to about 50° C. a time range of from about 5 to about 15 minutes.

Where the process of the present invention additionally comprises a pre-etching step in which the surface of the polymer is pretreated with sulfuric acid, which may additionally comprise a swellant for the polymer, the swellant useable is selected from the same group of materials as listed above. Similarly, the amount of swellant required may be reduced by carrying out the process in the presence of a concentrated aqueous solution of an alkali metal or alkaline earth metal salt.

The main objectives of the pretreatment by pre-etching are: (1) to minimize dilution of the etching bath, (2) prevent decomposition of NSA, and (3) partially etch and/or swell the plastic. Pre-etching is not an absolutely essential step. However, pre-etched samples usually have higher adhesion of the plated metals. A formulation which significantly does not affect the etching formulation and minimizes the drag-in of water for the NSA-etching system, can be used as a pre-etching formulation. It is also preferred that the pre-etching treatment does a partial etching. Partially etched parts are easier to etch with the etching system.

In a further embodiment, the pre-etch step may be carried out in the absence of acid as including a swelling step.

Where this mode is employed, the swellant may be any of those listed above which are usable in the presence of acid or at least one member of the group consisting of C1-C5 alkyl-amides, -pyrrolidones, and di(C1 -C5 alkyl) -ketones, -formamides and sulfoxides, C1-C5 alkyl C1-C5 alkanoates, poly(C2-C5 alkylene glycol), C1-C5 alkanoates and cyclic C2-C5 alkylene carbonates. Most suitably, this additional swellants may be N-methyl pyrrolidone, dimethylformamide, 2-butanone, ethyl acetate, triethylene glycol, ethyl carbonate, butyrolactone, or propylene carbonate.

Again, in this mode, the amount of swellant required may be reduced by carrying out the process in the presence of an aqueous solution of an alkali metal hydroxide as well as, as previously a concentrated aqueous solution of an alkali metal salt or alkaline earth metal salt.

The pretreatment steps are suitably carried out in a temperature range of from about 10° to about 90° C., and in a time range of from about 2 to about 15 minutes.

NSA produces brown fumes when the etched parts are rinsed with water. Hence, it is preferred that etched parts are rinsed with a solvent/solution which minimizes the fumes and does not reduce the subsequent adhesion of the metals and paints. The parts etched with NSA solution can be post-treated with a base or oxidant solution for neutralization/oxidation of the acids.

Where a post etching step is employed, and this may be done whether or not the etching step has been preceded by a pre-etching step, the oxidants may be at least one member selected from the group consisting of potassium permanganate, halogens, ferric salts, metal chlorates, bromates, iodates, hypochlorates, hydrogen peroxide, manganese dioxide and nitric acid, most suitably, nitric acid and hydrogen peroxide.

The post etching step is suitably carried out in a temperature range of from about 20° to about 60° C. and in a time range of from about 1 to about 10 minutes.

It is preferred that only one bath each is used for the pre-etching, etching and post-etching steps. However, more than one bath of pre-etching, etching and post-etching solutions can be used for proper etching. For example, one can use two pre-etching baths; the first one having 60% sulfuric acid followed by 75% sulfuric acid and two post etching baths; the first one having 75% sulfuric acid followed by 50% sulfuric acid.

Plastic parts can be rinsed with water after pre-etching and etching treatments. However, the preferred process is not to rinse parts after the pre-etching and etching treatments. Rinsing plastic parts after pre-etching and etching causes pollution due to the generation of brown fumes. It is preferred that pre-etched parts be directly immersed in the etching bath and etched parts be directly immersed in the post-etching bath. The rinse may contain a base and/or oxidant to neutralize or decompose the acids.

A wetter/surfactant is suitably added in the etching formulations to increase the rate of reaction at the surface of the plastics. The wetter should be stable in etching bath and should make the plastic parts wettable with the pre-etching, etching and post-etching formulations. Fluorocarbon surfactants having —$SO_3H$ and $N^+$ functionalities are preferred wetters. Fluorochemical surfactants sold, for example, under trade names of Zonyls (E. I. du Pont de Nemours and Company), Fluorad (3M company) and Forafac (Atochem) can be used as wetters.

Plastics are nonwettable with water and hence they are generally painted with solvent borne paints. The process of the present invention permits plastics etched with NSA be painted with waterborne paints. The adhesion of waterborne paints was excellent.

Plastics, being lighter, corrosion resistant, strong and durable, have been replacing metals in finished products at an increasing rate, especially, in automobile, business machine and other industries. A broad range of engineering thermoplastics and thermosets, such as SMC (sheet molding compound), polyurea, polyurethane, polypropylene, polyethylene, polyphenylene oxide, polycarbonate, ABS, nylon, polyvinylchloride, phenolics, and a host of others are used in cars. A variety of paints are used to coat plastics. They include acrylics, alkyd, epoxies, polyesters, vinyls, olefins, and polyurethanes paints. Solvent borne paints contain about 40-70% volatile organic liquids. These organic liquids evaporate when the paint is coated on a substrate. These volatiles create two major problems: (1) they pollute the atmosphere and (2) they affect the physical properties of plastics.

Plastics have hydrophobic surfaces. Most waterborne paints do not bond well with plastics unless they contain proper additives and some organic solvents. There is a need for surface treatment of plastics which could make the surface accept all kinds of waterborne paints and provides a strong bond between the paint and the surface. The surfaces of plastics can be made hydrophilic and micro-roughened by etching, so that they can accept waterborne paints and provide satisfactory adhesion. The hydrophilic groups will make the surface wettable with water and hence waterborne paints will wet the surface and will spread uniformly on the surfaces. The hydrophilic groups will also help in providing better adhesion by interaction with ionic and polar groups (e.g., —OH, —$NH_2$, —$CONH_2$, —CONH—, —COOH, —O, —CO—, etc.) of the paints.

The process of the present invention permits regular and irregular shaped, nonplatable, conductors and nonconductors, to be plated if they are coated with etchable polymers such as ABS, etched with the NSA system, followed by plating electroless nickel. Once metallized, the parts can be plated with other metals. An emulsion, suitably of ABS is coated on a variety of substrates including conductors and nonconductors. The coated parts were etched and plated using the formulation and procedures of the present invention. Similarly, conductors and non-conductors can be metallized. Though the parts were coated and plated the parts completely, by partial/selected coating, one can achieve, partial/selective metallization. The etching can also be done with other etching systems, e.g., chromic acid.

NSA etches unsaturated polymers, such as polybutadiene much faster than other polymers. If the polymers, such as polybutadiene and ABS which are easy to etch are coated on any substrate, they can be etched and plated. Emulsions of ABS were prepared by dissolving platable grade ABS (EP) in some representative solvents, such as acetone, ethylacetate, acetonitrile, chloroform, dichlorobenzene, ethylene glycol diacetate, propylene carbonate, xylene, and butyrolactone. The solutions were milky and hence referred hereto as emulsions. A solvent which wets and/or swells the substrate and evaporates within reasonable time (e.g., 10 minutes at room temperature or proportionally lower time at higher temperatures) is preferred. One can use a mixture of solvents.

Flat and irregular shaped pieces of plastics, ceramics, rocks, metals, wood and glass were coated with the emulsion of ABS. The coated parts etched and plated using the formulations and the procedures of the present invention. Though the parts were plated with electroless nickel and electrolytic copper, they can also be plated with other metals.

Though the concept was demonstrated with emulsion of ABS, emulsion/solution/dispersion of other etchable polymers/plastics can also be used. The prefer polymers are unsaturated polymers such as ABS and polybutadiene. The most preferred polymer for the coating is platable grade ABS. The emulsions/solutions/dispersions can either be made by direct polymerization or by dissolving/dispersing the polymers in a suitable solvent. The adhesion of the plated metals depends upon (1) polymer for coating, (2) the solvent and (3) substrate. For acceptable bonding with the substrate, it is preferred that a proper solvent/polymer be selected.

Coating of the etchable polymers can be done by a variety of coating techniques, including selective coating, e.g., brush, immersion, spraying, electrostatic spraying, electrodeposition, lamination, calendering, painting, in-mold, gravure, blade, reverse roll, slot, air knife, off-set, extrusion and curtain coating.

EXAMPLES

EXAMPLE 1

Etching and plating of ABS:

Plaques of ABS (EP, EPB and EPBM grades made by General Electric Co., Schenectady, N.Y.) were cleaned with a detergent solution, rinsed with water and etched with the following etching system:
[A] Pre-etching:
  Sulfuric acid: 750 grams
  Water: 250 grams
  Nitric acid (70%): 12 ml
  Wetter: 5 ml of 820 LF (Enthone Inc., West Haven, Conn.)
  Temperature: 50° C.
  Time: 8 minutes
[B] Etching
  Sulfuric acid: 700 grams
  Water: 180 grams
  Nitric acid (70%): 2.5 ml
  NSA (solid): 120 grams
  Wetter: 5 ml of 820 LF
  Temperature: 30° C.
  Time: 5 minutes
[C] Post-treatment
  Sulfuric acid: 650 grams
  Water: 350 grams
  Wetter: 5 ml of 820 LF
  Temperature: 30° C.
  Time: 3 minutes The etched parts were rinsed with water and then plated with electroless nickel using commercially available formulations and procedures described in Example 1 of U.S. Pat. No. 5,160,600. The parts were then plated with electrolytic copper, annealed at 60° C. for an hour and peel strength was determined using a spring scale. The peel strength for EP was 2 kg/cm and 1.5 kg/cm for EPB and EPBM.

In accordance with the above procedure, but where, in place of ABS there is utilized polycarbonate, polybutadiene, polyepoxide, polyphenylene sulfide, polycaprolactone, nylon 6 and 66, polyethylene terephthalate, cellulose acetate, polyvinylacetate, polymethyl-methacrylate, phenol-formaldehyde resin, polyphenylene oxide, polyurea, polyurethane, SMC (sheet molding compound), polyvinylbutyral, polyacrylonitrile, or polychloroprene a similar result is obtained.

In accordance with the above procedure, but where, in place of nitrosyl sulfuric acid as etchant, there is used nitrosonium tetrafluoroborate, nitrosoniumhexafluorophosphate, nitrosoniumhexachloro-antimonate, nitrosonium halides, nitrosonium nitrate, nitrosonium phosphate, nitrosonium carboxylates, nitrosonium perchlorate, $NOPF_6$, NOPF, metal nitrosyls, nitrosyl halides, nitrosyl acetate, nitrosyl sulfate, nitrosyl sulfuric anhydride and mixtures thereof a similar result is obtained.

In accordance with the above procedure, but where, in place of sulfuric acid there is used as the solvent in etching step [A], at least one member of the group consisting of nitric acid, hydrochloric acid, phosphoric acid, acetic acid, propionic acid, benzoic acid, methanesulphonic acid, benzenesulphonic acid and trifluoromethane sulphonic acid a similar result is obtained.

EXAMPLE 2

Etching with NSA solution only:

Plaques of ABS (EP and EPB) were cleaned with a detergent solution, rinsed with water and etched with the following NSA solution:
Sulfuric acid: 350 grams
Water: 90 grams
NSA (solid): 50 grams
Wetter: 2.5 ml of 820 LF
Temperature: 30° C.
Time: 6 minutes The etched parts were rinsed with water for three minutes at room temperature. When the etched parts went into water, brown fumes were emitted. The parts were then plated with electroless nickel and electrolytic copper using commercially available formulations and procedures described in Example 1 of U.S. Pat. No. 5,160,600. The parts were then annealed at 60° C. for an hour. The peel strength for EP was 1.2 kg/cm and 0.7 kg/cm for EPB.

In accordance with the above procedure, but where, in place of nitrosyl sulfuric acid as etchant, there is used nitrosonium tetrafluoroborate, nitrosoniumhexafluorophosphate, nitrosoniumhexachloro-antimonate, nitrosonium halides, nitrosonium nitrate, nitrosonium phosphate, nitrosonium carboxylates, nitrosonium perchlorate, $NOPF_6$, NOPF, metal nitrosyls, nitrosyl halides, nitrosyl acetate, nitrosyl sulfate, nitrosyl sulfuric anhydride and mixtures thereof a similar result is obtained.

EXAMPLE 3

Etching without post-etching:

Plaques of ABS (EP and EPB) were cleaned with a detergent solution, rinsed with water and etched with the following solutions:
[A] Pre-etching:
  Sulfuric acid: 750 grams
  Water: 250 grams
  Wetter: 5 ml of 820 LF (Enthone Inc., West Haven, Conn.)
  Temperature: 50° C.
  Time: 1 minutes
[B] Etching
  Sulfuric acid: 350 grams
  Water: 90 grams
  NSA (solid): 50 grams
  Wetter: 2.5 ml of 820 LF
  Temperature: 30° C.
  Time: 6 minutes The etched parts were rinsed with water for three minutes at room temperature. When the etched parts went into water, brown fumes were emitted. The parts were then plated with electroless nickel and electrolytic copper using commercially available formulations and procedures described in Example 1 of U.S. Pat. No. 5,160,600. The parts were then annealed at 60° C. for an hour. The peel strength for EP was 1.5 kg/cm and 0.7 kg/cm for EPB.

EXAMPLE 4

Etching without pre-etching:

Plaques of ABS (EP and EPB) were cleaned with a detergent solution, rinsed with water and etched with the following solutions:
[A] Etching
  Sulfuric acid: 350 grams
  Water: 90 grams
  NSA (solid): 50 grams
  Wetter: 2.5 ml of 820 LF
  Temperature: 30° C.
  Time: 6 minutes
[B] Post-treatment
  Sulfuric acid: 650 grams
  Water: 350 grams
  Wetter: 5 ml of 820 LF
  Temperature: 30° C.
  Time: 3 minutes The etched parts were rinsed with water for three minutes at room temperature. The parts were then plated with electroless nickel and electrolytic copper using commercially available formulations and procedures described in Example 1 of U.S. Pat. No. 5,160,600. The parts were then annealed at 60° C. for an hour. The peel strength for EP was 1.7 kg/cm and 0.7 kg/cm for EPB.

In accordance with the above procedure, but where, in place of sulfuric acid there is used as the solvent in etching step [A], at least one member of the group consisting of nitric acid, hydrochloric acid, phosphoric acid, acetic acid, propionic acid, benzoic acid, methanesulphonic acid, benzenesulphonic acid and trifluoromethane sulphonic acid a similar result is obtained.

EXAMPLE 5

Benzene sulfonic acid (BSA) as swellant in the pre-etching bath

Plaques of ABS (EP and EPB) were cleaned with a detergent solution, rinsed with water and etched with the following etching system:
[A] Pre-etching:
  Sulfuric acid: 750 grams
  Water: 250 grams
  Wetter: 5 ml of 820 LF (Enthone Inc., West Haven, Conn.)
  BSA: 50 grams
  Temperature: 0° C.
  Time: 5 minutes
[B] Etching:
  Sulfuric acid: 350 grams
  Water: 90 grams
  NSA (solid): 50 grams
  Wetter: 2.5 ml of 820 LF
  Temperature: 30° C.
  Time: 6 minutes
[C] Post-treatment
  Sulfuric acid: 650 grams
  Water: 350 grams
  Wetter: 5 ml of 820 LF
  Temperature: 30° C.
  Time: 3 minutes The etched parts were rinsed with water and then plated with electroless nickel and electrolytic copper using commercially available formulations and procedures described in Example 1 of U.S. Pat. No. 5,160,600. The parts were then annealed at 60° C. for an hour. The peel strength for EP and EPB was 2 kg/cm.

In accordance with the above procedure, but where, in place of sulfuric acid there is used in the post etching bath, potassium permanganate, halogens, ferric salts, metal chlorates, bromates, iodates hypochlorates, hydrogen peroxide, manganese dioxide or nitric acid, a similar result is obtained.

EXAMPLE 6

Propylene carbonate (PC) as swellant

Plaques of ABS (EP and EPB) were cleaned with a detergent solution, rinsed with water and etched with the following etching system:
[A] Swelling of ABS:
  Saturated NaCl Solution: 1000 ml
  PC: 25 ml
  Temperature: 60° C.
  Time: 3 minutes
  Water Rinse: 3 minutes at room temperature In accordance with the above procedure, but where in place of saturated aqueous sodium chloride, there is utilized 10% aqueous sodium hydroxide or 50% aqueous calcium chloride solution, the amount of swellant required is similarly reduced.
[B] Etching:
  Sulfuric acid: 350 grams
  Water: 90 grams
  NSA (solid): 50 grams
  Wetter: 2.5 ml of 820 LF
  Temperature: 30° C.
  Time: 3 minutes
[C] Post-treatment
  Sulfuric acid: 650 grams
  Water: 350 grams
  Wetter: 5 ml of 820 LF
  Temperature: 30° C.
  Time: 3 minutes The etched parts were rinsed with water and then plated with electroless nickel and electrolytic copper using commercially available formulations and procedures described in Example 1 of U.S. Pat. No. 5,160,600. The parts were then annealed at 60° C. for an hour. The peel strength for EP and EPB was 1.5 kg/cm.

In accordance with the above procedure, but where, as swellant in the pre treatment bath, in place of propylene carbonate there is used acetic acid, propionic acid, methanesulfonic acid, diphenyl ether, ethylene glycol dimethyl ether, tetrahydrofuran, trichloroethanol, trichloroacetic acid, trichlorosulfonic acid, trichlorobenzene, octane, toluene, xylene, N-methyl pyrrolidone, dimethylformamide, 2-butanone, ethyl acetate, ethylene glycol, butyrolactone or ethyl carbonate, a similar result is obtained.

EXAMPLE 7

Painting of etched ABS:

Plaques of ABS were etched with the etching system of Example 1. Etched parts, while still slightly moist were painted by dip-coating and/or airspray technique with a polyacrylic latex paint made by Red Devil, polyurethane oil enamel by Red Devil, and a water based automotive paint from Du Pont (#408R49912). The painted plaques were first allowed to dry at room temperature for 10 minutes followed by drying at 60° C. for 2-10 hours. Etched parts were dried and painted with a solvent borne paint (polyurethane oil) and dried. The adhesion of the paints was tested with the cross-Hatch test (ASTM Method D-3359). The plaques passed the crosshatch test.

In accordance with the above procedure, but where in place of ABS, the plastic painted is an engineering thermoplastic or and thermoset, such as SMC (sheet molding compound), polyurea, polyurethane, polypropylene, polyethylene, poly-phenyleneoxide, polycarbonate, nylon, polyvinylchloride, phenolics a similar result is obtained.

Similar results are obtained where the paints used are alkyd, epoxy,, polyester, vinyl and olefins paints.

EXAMPLE 8

Emulsion of ABS:

250 grams of plaques of platable grade ABS (i.e., EP) were cut into small pieces. The pieces were added in a 1000 ml beaker containing 450 ml acetonitrile and 150 ml of ethylene glycol diacetate under vigorous stirring. The mixture was stirred overnight. A milky white emulsion of ABS was obtained.

In accordance with the above procedure, but where in place of ABS, the plastic emulsified is a polyurea, polyurethane, polyisoprene, polycarbonate, polyepoxide, polycarboxyl ester, polyamide, polyacrylate, halopolymer or their copolymers or alloys a similar result is obtained.

EXAMPLE 9

Solution of Polybutadiene

A solution of 6.5 gm of polybutadiene was dissolved in 65 ml of cyclohexane. A clear solution was obtained which was coated on a plaque of polystyrene and a wood chip and allowed to dry for one hour at room temperature. The coated parts were then etched and plated with electroless nickel using the formulations and the procedures of Example 1. The adhesion of electroless nickel was excellent.

In accordance with the above procedure, but where in place of polybutadiene the plastic dissolved is a polyurea, polyurethane, polyisoprene, polycarbonate, polyepoxide, polycarboxyl ester, polyamide, polyacrylate, halopolymer or their copolymers or alloys a similar result is obtained.

EXAMPLE 10

Metallization of Conductors and Nonconductors:

Flat and irregular shaped pieces of nonplatable grade ABS, polystyrene, polyethylene, polycarbonate (polybisphenol-A carbonate), polymethylmethacrylate, glass, rock, aluminum, cardboard, and carved wood were mounted on stainless steel racks and coated either by brushing or spraying the emulsion of Example 8. The coated parts were dried in air for about 10 minutes at room temperature followed by drying in an oven at 70° C. for five hours. The emulsion dried to a clear coat of about 1-2 mil (25-50 micrometer). The ABS coated parts were not wettable with water. The coated parts were then etched and plated with electroless nickel followed by electrolytic copper using the formulations and the procedures of Example 1. All parts became wettable with water after the etching. All parts plated with excellent adhesion of electroless nickel and electrolytic copper.

In accordance with the above procedure, but where in place of ABS, the plastic painted is an engineering thermoplastic or and thermoset, such as SMC (sheet molding compound), polyurea, polyurethane, polypropylene, polyphenylene oxide, nylon, polyvinylchloride, phenolics a similar result is obtained.

We claim:

1. A process of etching the surface of polymeric materials made of polymers having at least one oxidatively degradable functionality which comprises treating said surface with a solution of at least one member of the etchant group consisting of nitronium, nitrosonium ions and complexes thereof, in a solvent containing less than 40% by weight of water and nitroacidium ions and complexes thereof.

2. A process of claim 1 wherein the solution contains between 1 to 40% by weight of at least one member of the etchant group.

3. The process of claim 2 wherein the solvent comprises at least one member of the group consisting of mineral acids, and aliphatic and aromatic carboxylic and sulfonic acids.

4. The process of claim 3 wherein the solvent comprises at least one member of the group consisting of sulfuric acid, nitric acid, hydrochloric acid, phosphoric acid, acetic acid, propionic acid, benzoic acid, methanesulphonic acid, benzenesulphonic acid and trifluoromethane sulphonic acid.

5. The process of claim 2 wherein the solvent comprises sulfuric acid.

6. The process of claim 2 wherein the solvent additionally comprises a cosolvent.

7. The process of claim 6 wherein the cosolvent is a swellant for the polymer.

8. The process of claim 1 wherein the cosolvent is selected from the group consisting of organic acids, sulfoxides, ethers, sulfolane, halocarbons, haloalkanols and haloalkanoic acids, hetero linear and cyclic-compounds containing oxygen, and hydrocarbons.

9. The process of claim 8 wherein the cosolvent is selected from the group consisting of C1-C5 alkanoic acids, C1-C5 alkyl-, phenyl- and C1-C5 alkyl-phenylsulfonic acids, diphenyl and di(C1-C5 alkyl)phenyl ethers, C2-C5 alkylene glycol di(C1-C5 alkyl)ethers, C4-C6 cycloalkylethers, polyhalo C1-C5 alkanols, polyhalo C1-C5 alkanoic acids, trihalosulfonic acids, polyhalobenzenes and polyhalo C1-C5 alkyl benzenes, C7-C12 alkyl- and aryl- and alkaryl hydrocarbons.

10. The process of claim 8 wherein the swellant is selected from the group consisting of acetic acid, propionic acid, methane- and benzene sulfonic acids, diphenyl ether, ethylene glycol dimethyl ether, tetrahydrofuran, trichloroethanol, trichloroacetic acid, trichlorosulfonic acid, trichlorobenzene, octane, toluene and xylene.

11. The process of claim 8 wherein the amount of swellant required is reduced by carrying out the process in the presence of a concentrated aqueous solution of an alkali metal or alkaline earth metal salt.

12. The process of claim 1 which is carried out in a temperature range of from about 10° to about 90° C.

13. The process of claim 1 which is carried out in a temperature range of from about 20° to about 50° C.

14. The process of claim 12 which is carried out in a time range of from about 5 to about 15 minutes.

15. The process of claim 1 additionally comprising a pretreatment step in which the surface of the polymer is pretreated with sulfuric acid containing from about 25 to about 85 wt. % of sulfuric acid in the presence of 0 to 10 wt. % of nitric acid.

16. The process of claim 15 additionally comprising a swellant for the polymer.

17. The process of claim 16 wherein the amount of swellant required is reduced by carrying out the process in the presence of a concentrated aqueous solution of an alkali metal salt or alkaline earth metal salt.

18. The process of claim 16 wherein the swellant is selected from the group consisting of organic acids, sulfoxides, ethers, sulfolane, halocarbons, haloalkanols and haloalkanoic acids, hetero linear and cyclic-compounds containing oxygen, and hydrocarbons.

19. The process of claim 18 wherein the swellant is selected from the group consisting of C1-C5 alkanoic acids, C1-C5 alkyl-, phenyl- and C1-C5 alkyl-phenylsulfonic acids, diphenyl and di(C1-C5 alkyl)phenyl ethers, C2-C5 alkylene glycol di(C1-C5 alkyl)ethers, C4-C6 cycloalkylethers, polyhalo C1-C5 alkanols, polyhalo C1-C5 alkanoic acids, trihalosulfonic acids, polyhalobenzenes and poly-halo C1-C5 alkyl benzenes, C7-C12 alkyl- and aryl-and alkaryl hydrocarbons.

20. The process of claim 19 wherein the swellant is selected from the group consisting of acetic acid, propionic acid, methane- and benzene sulfonic acids, diphenyl ether, ethylene glycol dimethyl ether, tetrahydrofuran, trichloroethanol, trichloroacetic acid, trichlorosulfonic acid, trichlorobenzene, octane, toluene and xylene.

21. The process of claim 15 which is carried out in a temperature range of from about 10° to about 90° C.

22. The process of claim 15 which is carried out in a time range of from about 2 to about 15 minutes.

23. The process of claim 1 additionally comprising a postetching step in which the surface of the polymer is posttreated with at least one member of the group consisting of sulfuric acid containing from about 25 to about 80 wt. % of sulfuric acid and agents capable of oxidizing nitronium, nitrosonium or nitroacidium ions.

24. The process of claim 23 wherein the oxidizing agent is at least one member selected from the group consisting of potassium permanganate, halogens, ferric salts, metal chlorates, bromates, iodates and hypochlorates, hydrogen peroxide, manganese dioxide and nitric acid.

25. The process of claim 15 additionally comprising a postetching step in which the surface of the polymer is posttreated with at least one member of the group consisting of sulfuric acid containing from about 25 to about 80 wt. % of sulfuric acid and agents capable of oxidizing nitronium, nitrosonium or nitroacidium ions.

26. The process of claim 25 wherein the oxidizing agent is at least one member selected from the group consisting of potassium permanganate, halogens, ferric salts, metal chlorates, bromates, iodates and hypochlorates, hydrogen peroxide, manganese dioxide and nitric acid.

27. The process of claim 23 which is carried out in a temperature range of from about 20° to about 60° C.

28. The process of claim 23 which is carried out in a time range of from about 1 to about 10 minutes.

29. The process of claim 25 which is carried out in a temperature range of from about 20° to about 60° C.

30. The process of claim 25 which is carried out in a time range of from about 1 to about 10 minutes.

31. The process of claim 1 wherein the etchant group is selected from the group consisting of nitrosyl sulfuric acid, nitrosonium tetrafluoroborate, nitrosonium hexafluorophosphate, nitrosonium hexachloroantimonate, nitrosonium halides, nitrosonium nitrate, nitrosonium phosphate, nitrosonium carboxylates, nitrosonium perchlorate, $NOPF_6$, NOPF, metal nitrosyls, nitrosyl halides, nitrosyl acetate, nitrosyl sulfate, nitrosyl sulfuric anhydride and mixtures thereof.

32. The process of claim 1 wherein the etchant group comprises nitrosyl sulfuric acid.

33. The process of claim 1 wherein the polymers are selected from the group consisting of polyanhydrides, polycarboxylesters, polysulphonic esters, unsaturated polyolefins, polyepoxides, polycarbonates, polyamides, polyesters, polyacrylates, thermosets, polyurethanes, polyepoxys, halo polymers and alloys of such polymers.

34. The process of claim 1 wherein the polymers are selected from the group consisting of copolymers of acrylonitrile, butadiene and styrene, and alloys thereof with polycarbonate; polycarbonate, polybutadiene, polyepoxide, polyphenylene sulfide, polycaprolactone, nylon 6 and 66, polyethylene terephthalate, cellulose acetate, polyvinylacetate, polymethylmethacrylate, phenol-formaldehyde resin, polyphenylene oxide, polyurea, polyurethane, SMC (sheet molding compound), polyvinylbutyral, polyacrylonitrile, polychloroprene and alloys of said polymers.

35. The process of claim 13 wherein the polymers are selected from the group consisting of polystyrene, polyvinylchloride, polyethylene and polypropylene.

36. The process of claim 1 of etching the surface of polymeric materials made of polymers having at least one oxidatively degradable functionality to provide a water wettable surface capable of being painted with a water based paint to provide a painted layer having a satisfactory level of adhesion to said surface which comprises treating said surface with a solution of at least one member of the etchant group consisting of nitrosonium, nitronium ions and complexes thereof, in a solvent containing less than 40% by weight of water and nitroacidium ions and complexes thereof.

37. The process of claim 1 of etching the surface of polymeric materials made of polymers having at least one oxidatively degradable functionality to provide a water wettable surface capable of being plated with electroless nickel or electroless copper to provide a plated layer having a satisfactory level of adhesion to said surface which comprises treating said surface with a solution of at least one member of the etchant group consisting of nitrosonium, nitronium ions and complexes thereof, in a solvent containing less than 40% by weight of water and nitroacidium ions and complexes thereof.

38. A process of preparing substantially a non platable polymeric surface to make it capable of being plated by electroless plating which comprises the steps of:

i) preparing an emulsion of a copolymer of acrylonitrile, butadiene and styrene, in a mixture of acetonitrile and ethylene glycol diacetate, ii) coating said emulsion on said non platable surface, iii) drying said emulsion to provide an etchable surface, iv) subjecting said etchable surface to the process of claim 1.

39. The process of claim 36 additionally comprising the steps of:

a) washing said surface to remove the etching agent therefrom, b) painting said surface with a water based paint.

40. The process of claim 37 additionally comprising the steps of:

a) washing said surface to remove the etching agent therefrom, b) plating said surface with electroless nickel or electroless copper.

41. The process of claim 38 additionally comprising the steps of:

v) washing said surface to remove the etching agent therefrom, vi) painting said surface with a water based paint.

42. The process of claim 32 additionally comprising the steps of:
   v) washing said surface to remove the etching agent therefrom,
   vi) plating said surface with electroless nickel or electroless copper.

43. The process of claim 1 additionally comprising a prior swelling step in which the surface of the polymer is pretreated with swellant therefor.

44. The process of claim 4 wherein the swellant is selected from the group consisting of organic acids, nitrocompounds, amides, esters, carbonates, sulfoxides, ethers, ketones, sulfolane, halocarbons, haloalkanols and haloalkanoic acids, hetero linear and cyclic-compounds containing oxygen, and hydrocarbons.

45. The process of claim 44 wherein the swellant is selected from the group consisting of C1-C5 alkanoic acids, C1-C5 alkyl-, phenyl- and C1-C5 alkyl-phenyl-sulfonic acids, diphenyl and di(C1-C5 alkyl)phenyl ethers, C2-C5 alkylene glycol di(C1-C5 alkyl)ethers, C4-C6 cycloalkylethers, polyhalo C1-C5 alkanols, polyhalo C1-C5 alkanoic acids, trihalosulfonic acids, polyhalobenzenes and poly-halo C1-C5 alkyl benzenes, C7-C12 alkyl- and aryl- and alkaryl hydrocarbons, C1-C5 alkyl-amides, -pyrrolidones, and di(C1-C5 alkyl) -ketones,-formamides and -sulfoxides, C1-C5 alkyl C1-C5 alkanoates, C2-C5 alkylene glycol C1-C5 alkanoates and cyclic C2-C5 alkylene carbonates.

46. The process of claim 45 wherein the swellant is selected from the group consisting of acetic acid, propionic acid, methane- and benzene sulfonic acids, diphenyl ether, ethylene glycol dimethyl ether, tetrahydrofuran, trichloroethanol, trichloroacetic acid, trichlorosulfonic acid, trichlorobenzene, octane, toluene, xylene, N-methyl pyrrolidone, dimethylformamide, 2-butanone, ethyl acetate, ethylene glycol, ethyl carbonate and propylene carbonate.

47. The process of claim 43 wherein the amount of swellant required is reduced by carrying out the process in the presence of an aqueous solution of an alkali metal hydroxide or a concentrated aqueous solution of an alkali metal or alkaline earth metal salt.

48. A process of etching the surface of polymeric materials made of polymers having at least one oxidatively degradable functionality, which method comprises
   pretreating said polymer surface with a composition comprising sulfuric acid containing from about 25 to about 85 wt. % of sulfuric acid in the presence of 0 to 10 wt. % of nitric acid, a swellant for the polymer, and a concentrated aqueous solution of an alkali metal salt or alkaline earth metal salt; and
   treating said surface with a solution of at least one member of the etchant group consisting of nitronium, nitrosonium ions and complexes thereof.

49. The process of claim 48 where said solvent contains less than 40% by weight of water and nitroacidium ions and complexes thereof.

50. The process of etching the surface of polymeric materials made of polymers having at least one oxidatively degradable functionality to provide a water wettable surface capable of being painted with a water based paint to provide a painted layer having a satisfactory level of adhesion to said surface, said process comprising treating said surface with a solution of at least one member of the etchant group consisting of nitrosonium, nitronium ions and complexes thereof, in a solvent containing less than 40% by weight of water and nitroacidium ions and complexes thereof.

\* \* \* \* \*